(12) United States Patent
Saito et al.

(10) Patent No.: US 7,075,125 B2
(45) Date of Patent: Jul. 11, 2006

(54) POWER SEMICONDUCTOR DEVICE (75) Inventors: Wataru Saito, Kawasaki (JP); Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 10/806,397

(22) Filed: Mar. 23, 2004

(65) Prior Publication Data
US 2005/0062069 A1  Mar. 24, 2005

(30) Foreign Application Priority Data
Sep. 19, 2003  (JP)  ............................. 2003-327654

(51) Int. Cl.
*H01L 31/0328* (2006.01)
(52) U.S. Cl. ........................... 257/194; 257/488
(58) Field of Classification Search ................ 257/194, 257/488, 496
See application file for complete search history.

(56) References Cited

U.S. PATENT DOCUMENTS

| | | | |
|---|---|---|---|
| 4,727,404 A * | 2/1988 | Boccon-Gibod | ............. 257/284 |
| 6,100,571 A * | 8/2000 | Mizuta et al. | ............... 257/488 |
| 6,316,793 B1 * | 11/2001 | Sheppard et al. | ........... 257/103 |
| 6,483,135 B1 | 11/2002 | Mizuta et al. | |
| 6,555,851 B1 | 4/2003 | Morizuka | |
| 6,689,652 B1 | 2/2004 | Morizuka | |
| 2005/0062069 A1 * | 3/2005 | Saito et al. | ................. 257/213 |

FOREIGN PATENT DOCUMENTS

| | | |
|---|---|---|
| JP | 2001-237250 | 8/2001 |
| JP | 2002-118122 | 4/2002 |

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A power semiconductor device includes a first semiconductor layer of non-doped $Al_XGa_{1-X}N$ ($0 \leq X \leq 1$), and a second semiconductor layer of non-doped or n-type $Al_YGa_{1-Y}N$ ($0 \leq Y \leq 1$, $X<Y$) disposed on the first semiconductor layer. Source and drain electrodes are disposed separately from each other, and electrically connected to the second semiconductor layer. A gate electrode is disposed on the second semiconductor layer between the source and drain electrodes. An insulating film covers the second semiconductor layer between the gate and drain electrodes. A first field plate electrode is disposed on the insulating film and electrically connected to the gate electrode. A second field plate electrode is disposed on the insulating film and electrically connected to the source electrode.

19 Claims, 5 Drawing Sheets

POWER SEMICONDUCTOR DEVICE

CROSS-REFERENCE TO RELATED APPLICATIONS

This application is based upon and claims the benefit of priority from the prior Japanese Patent Application No. 2003-327654, filed Sep. 19, 2003, the entire contents of which are incorporated herein by reference.

BACKGROUND OF THE INVENTION

1. Field of the Invention

The present invention relates to a power semiconductor device used for controlling high power, and particularly to a nitride-based field effect transistor (FET) of the lateral type.

2. Description of the Related Art

A circuit, such as a switching power supply or inverter, employs a power semiconductor device, such as a switching device or diode. The power semiconductor device needs to have a high breakdown voltage and low on-resistance. The relationship between the breakdown voltage and on-resistance includes a tradeoff relationship determined by the device material. Progress in technical development so far has allowed the power semiconductor device to have a low on-resistance close to the limit determined by silicon, which is the main device material. Accordingly, it is necessary to change the device material, if a lower on-resistance is required.

In recent years, attention is being given to research on a power semiconductor device using a wide bandgap semiconductor. For example, it has been proposed to use a wide bandgap semiconductor, such as a nitride-based material (e.g., GaN, AlGaN) or a silicon carbide-based material (SiC), as the switching device material, in place of silicon. The use of such a semiconductor can improve the tradeoff relationship determined by the device material, thereby remarkably reducing the on-resistance.

A power semiconductor device of a nitride-based material, such as GaN, can realize an on-resistance lower than a power semiconductor device of Si. In this type, a power device having a HEMT (High Electron Mobility Transistor) structure provides an on-resistance as low as 1/100 of the Si limit or less.

In a lateral device, such as the HEMT structure, the electric field distribution between the gate and drain determines the breakdown voltage. Accordingly, if a high breakdown voltage is obtained along with a short distance between the gate and drain, a lower on-resistance can be realized. In this case, it is necessary to relax electric field concentrations at electrode corners. A field plate structure is known as an effective countermeasure against this. For example, Jpn. Pat. Appln. KOKAI Publication No. 2002-118122, and U.S. Pat. No. 6,483,135 disclose a GaN-based power HEMT having a field plate electrode.

Figure 14:
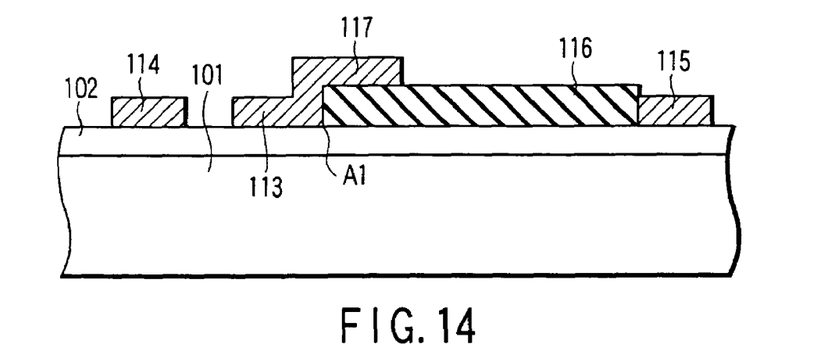
FIG. 14 is a sectional view schematically showing a conventional GaN-based power HEMT having a field plate electrode.
Figure 15:
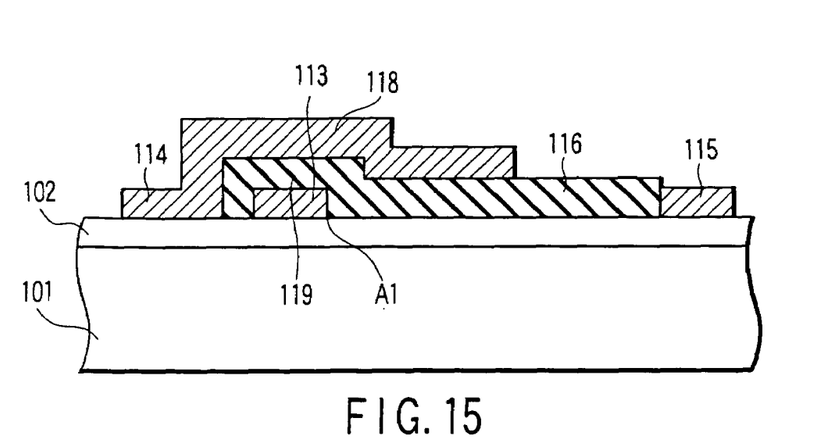
FIG. 15 is a sectional view schematically showing another conventional GaN-based power HEMT having a field plate electrode.

FIGS. 14 and 15 are sectional views each schematically showing a conventional GaN-based power HEMT having a field plate electrode.

Each of the HEMTs shown in FIGS. 14 and 15 includes a channel layer 101 of non-doped GaN, and a barrier layer 102 of n-type AlGaN disposed on the channel layer 101. A source electrode 114 and a drain electrode 115 are disposed separately from each other on the barrier layer 102. A gate electrode 113 is disposed between the source electrode 114 and drain electrode 115 on the barrier layer 102. The barrier layer 102 is covered with an insulating film 116 between the gate electrode 113 and drain electrode 115.

In the case of the HEMT shown in FIG. 14, a field plate electrode 117 is disposed on the insulating film 116 and electrically connected to the gate electrode 113. In the case of the HEMT shown in FIG. 15, a field plate electrode 118 is disposed on the insulating film 116 and electrically connected to the source electrode 114. The field plate electrode 118 is arranged to cover the gate electrode 113 with an insulating film 119 interposed therebetween.

BRIEF SUMMARY OF THE INVENTION

According to a first aspect of the present invention, there is provided a power semiconductor device comprising:

a first semiconductor layer of non-doped $Al_XGa_{1-X}N$ ($0 \leq X \leq 1$);

a second semiconductor layer of non-doped or n-type $Al_YGa_{1-Y}N$ ($0 \leq Y \leq 1$, $X<Y$) disposed on the first semiconductor layer;

source and drain electrodes disposed separately from each other, and electrically connected to the second semiconductor layer;

a gate electrode disposed on the second semiconductor layer between the source and drain electrodes;

an insulating film covering the second semiconductor layer between the gate and drain electrodes;

a first field plate electrode disposed on the insulating film and electrically connected to the gate electrode; and a second field plate electrode disposed on the insulating film and electrically connected to the source electrode.

According to a second aspect of the present invention, there is provided a power semiconductor device comprising:

a first semiconductor layer of non-doped $Al_XGa_{1-X}N$ ($0 \leq X \leq 1$);

a second semiconductor layer of non-doped or n-type $Al_YGa_{1-Y}N$ ($0 \leq Y \leq 1$, $X<Y$) disposed on the first semiconductor layer;

first and second contact layers of n-type $Al_ZGa_{1-Z}N$ ($0 \leq Z \leq 1$) disposed separately from each other on or in a surface of the second semiconductor layer, and having a resistivity lower than that of the second semiconductor layer;

source and drain electrodes disposed on the first and second contact layers, respectively;

a gate electrode disposed on the second semiconductor layer between the source and drain electrodes;

an insulating film covering the second semiconductor layer between the source and drain electrodes;

a first field plate electrode disposed on the insulating film and electrically connected to the source electrode; and a second field plate electrode disposed on the insulating film and electrically connected to the drain electrode.

According to a third aspect of the present invention, there is provided a power semiconductor device comprising:

a first semiconductor layer of non-doped $Al_XGa_{1-X}N$ ($0 \leq X \leq 1$);

a second semiconductor layer of non-doped or n-type $Al_YGa_{1-Y}N$ ($0 \leq Y \leq 1$, $X<Y$) disposed on the first semiconductor layer;

source and drain electrodes disposed separately from each other, and electrically connected to the second semiconductor layer;

a gate electrode disposed on the second semiconductor layer between the source and drain electrodes;

an insulating film disposed on the second semiconductor layer between the source and drain electrodes, and covering the gate electrode;

a first field plate electrode disposed on the insulating film and electrically connected to the source electrode;

a second field plate electrode disposed on the insulating film and electrically connected to the drain electrode; and a drain contact electrode disposed in contact with the first and second semiconductor layers at a position adjacent to the drain electrode, and electrically connected to the drain electrode.

DETAILED DESCRIPTION OF THE INVENTION

In the process of developing the present invention, the inventors studied conventional GaN-based power HEMTs shown in FIGS. 14 and 15, and so forth. As a result, the inventors have arrived at the findings given below.

In the structure shown in FIG. 14, the field plate electrode 117 relaxes the electric field concentration at a corner A1 of the gate electrode 113 due to the voltage between the gate and drain. In this structure, since the field plate electrode 117 is electrically connected to the gate electrode 113, the distance between the gate electrode 113 and drain electrode 115 is substantially smaller. As a consequence, the capacitance between the gate and drain, which is a predominant factor that determines the charge and discharge time in switching, becomes larger, whereby the switching takes longer, due to a lower switching speed.

On the other hand, in the structure shown in FIG. 15, the field plate electrode 118 relaxes the electric field concentration at a corner A1 of the gate electrode 113 due to the voltage between the gate and drain. In this structure, since the field plate electrode 118 is electrically connected to the source electrode 114, the voltage between the gate and source is applied to the corner A1 of the gate electrode 113. As a consequence, the corner A1 suffers another electric field concentration generated due to the voltage between the gate and source, thereby increasing the gate leakage current that flows from the gate electrode 113 to the drain electrode 115 through the barrier layer 102. In other words, the structure shown in FIG. 15 brings about a larger gate leakage current than the structure shown in FIG. 14.

Furthermore, the conventional GaN-based power HEMTs shown in FIGS. 14 and 15 realize an on-resistance as low as $\frac{1}{100}$ of the Si limit or less. However, in consideration of the properties of the GaN-based material, the on-resistance of the conventional GaN-based power HEMTs is as high as ten times the material limit or more. This problem seems to be caused because the design of GaN-based semiconductor devices has conventionally been based on communication devices, and has not sufficiently been considered for power devices.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

(First Embodiment)

Figure 1:
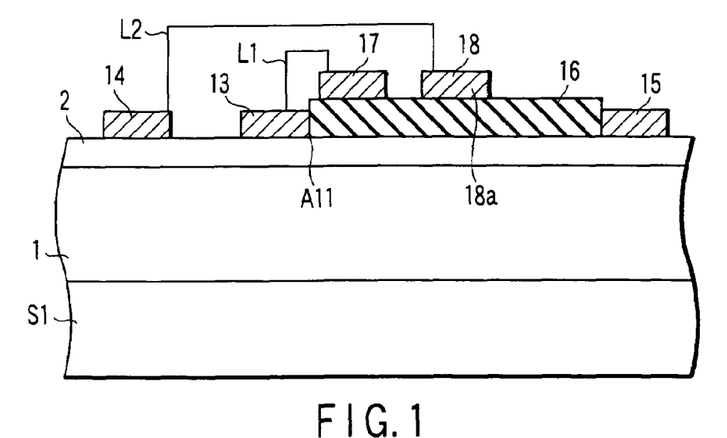
FIG. 1 is a sectional view schematically showing a nitride-based power semiconductor device (GaN-based power HEMT) according to a first embodiment of the present invention.

FIG. 1 is a sectional view schematically showing a nitride-based power semiconductor device (GaN-based power HEMT) according to a first embodiment of the present invention.

As shown in FIG. 1, this power HEMT includes a channel layer (first semiconductor layer) 1 of the non-doped type disposed on a support substrate S1 of sapphire, and a barrier layer (second semiconductor layer) 2 of the non-doped or n-type disposed on the channel layer 1. The channel layer 1 consists of $Al_XGa_{1-X}N$ ($0 \leq X \leq 1$), e.g., GaN. The barrier layer 2 consists of $Al_YGa_{1-Y}N$ ($0 \leq Y \leq 1$, X<Y), e.g., $Al_{0.2}Ga_{0.8}N$.

A source electrode 14 is disposed on and in electrical contact with the barrier layer 2. A drain electrode 15 is disposed on and in electrical contact with the barrier layer 2, and separately from the source electrode 14. A gate electrode 13 is disposed between the source electrode 14 and drain electrode 15 on the barrier layer 2, and faces the channel layer 1 through the barrier layer 2.

The barrier layer 2 is covered with a first insulating film 16 between the gate electrode 13 and drain electrode 15. A first field plate electrode 17 and a second field plate electrode 18 are disposed on the first insulating film 16. The second field plate electrode 18 is interposed between the first field plate electrode 17 and drain electrode 15. The first field plate electrode 17 is electrically connected to the gate electrode 13 through an outer interconnection L1. The second field plate electrode 18 is electrically connected to the source electrode 14 through an outer interconnection L2.

In the power HEMT shown in FIG. 1 according to the first embodiment, an intermediate electrode portion 18a of the second field plate electrode 18 is interposed between the first field plate electrode 17 and drain electrode 15 (in this embodiment, only the intermediate electrode portion 18a is shown as the second field plate electrode 18). The intermediate electrode portion 18a functions as a shield to substantially cancel the capacitance Cgd between the gate and drain, which is formed between the first field plate electrode 17 electrically connected to the gate electrode 13, and the drain electrode 15. As a consequence, the switching time becomes shorter, thereby increasing the switching speed, in either of the turn-on and turn-off operations.

In this case, since the first field plate electrode 17 electrically connected to the gate electrode 13 is disposed close to the second field plate electrode 18 electrically connected to the source electrode 14, the capacitance Cgs between the gate and source increases. Similarly, since the second field plate electrode 18 electrically connected to the source electrode 14 is disposed close to the drain electrode 15, the capacitance Csd between the source and drain also increases. However, it has been confirmed that the Cgd is a factor far more predominant than the Cgs and Csd, in determining the charge and discharge time in switching, and the switching speed is improved by reducing the Cgd, even if the Cgs and Csd increase.

In the power HEMT shown in FIG. 1 according to the first embodiment, the voltage between the gate and drain and the voltage between the gate and source (due to the second field plate electrode 18) are applied to a corner A11 of the gate electrode 13. However, the electric field concentration at the corner A11 due to these voltages is relaxed by the first field plate electrode 17 that covers the first insulating film 16 near the corner A11. This suppresses the gate leakage current that flows from the gate electrode 13 to the drain electrode 15 through the barrier layer 2. As a consequence, it is possible to increase the switching speed while reducing the gate leakage current.

(Second Embodiment)

Figure 2:
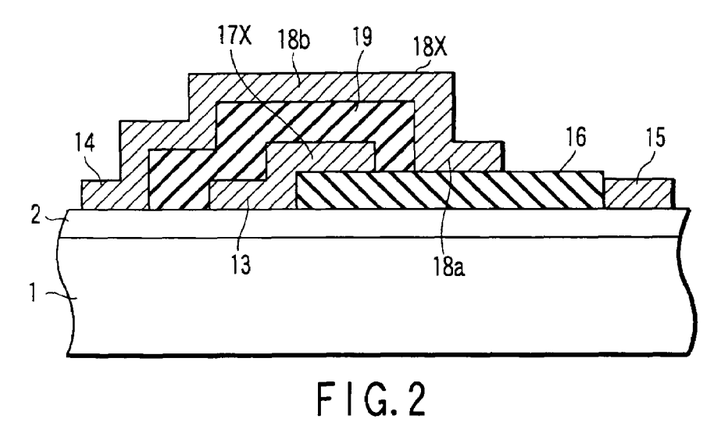
FIG. 2 is a sectional view schematically showing a nitride-based power semiconductor device (GaN-based power HEMT) according to a second embodiment of the present invention.

FIG. 2 is a sectional view schematically showing a nitride-based power semiconductor device (GaN-based power HEMT) according to a second embodiment of the present invention.

As shown in FIG. 2, this power HEMT includes semiconductor layers 1 and 2, an electrode 15, and an insulating film 16 in the same manner as in the power HEMT shown in FIG. 1, while it includes first and second field plate electrodes 17X and 18X disposed in a different manner from the first and second field plate electrodes 17 and 18 shown in FIG. 1. The first field plate electrode 17X is integrally formed with and thus electrically connected to a gate electrode 13. The second field plate electrode 18X is integrally formed with and thus electrically connected to a source electrode 14. The second field plate electrode 18X has an intermediate electrode portion 18a at its distal end, which is interposed between the first field plate electrode 17X and drain electrode 15 and disposed on the first insulating film 16. The second field plate electrode 18X also has a covering electrode portion 18b that connects the source electrode 14 to the intermediate electrode portion 18a, and covers the gate electrode 13 and first field plate electrode 17X through an insulating film 19.

In the power HEMT shown in FIG. 2 according to the second embodiment, it is possible by a simple process to manufacture a structure that can increase the switching speed while reducing the gate leakage current, as described above.

(Third Embodiment)

Figure 3:
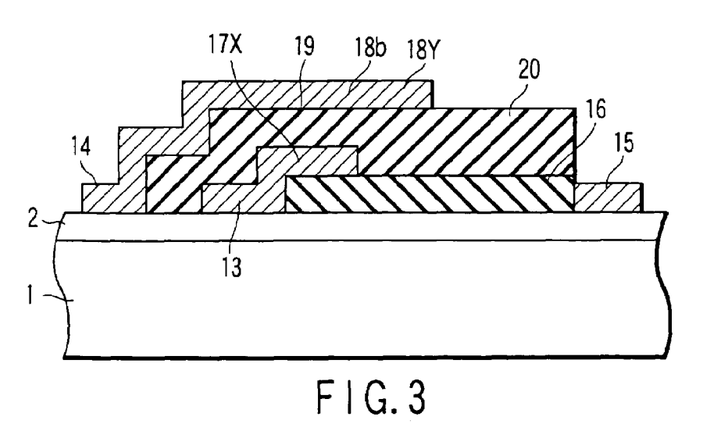
FIG. 3 is a sectional view schematically showing a nitride-based power semiconductor device (GaN-based power HEMT) according to a third embodiment of the present invention.

FIG. 3 is a sectional view schematically showing a nitride-based power semiconductor device (GaN-based power HEMT) according to a third embodiment of the present invention.

As shown in FIG. 3, this power HEMT includes semiconductor layers 1 and 2, electrodes 13, 15, and 17X, and an insulating film 16 in the same manner as in the power HEMT shown in FIG. 2, while it includes a second field plate electrode 18Y disposed in a different manner from the second field plate electrode 18X shown in FIG. 2. The second field plate electrode 18Y does not have an intermediate electrode portion 18a, but terminates at the distal end of a covering electrode portion 18b extending horizontally. The distal end side of the covering electrode portion 18b extends beyond the first field plate electrode 17X toward the drain electrode 15, and covers a barrier layer 2 through first and second insulating films 16 and 20. The second insulating film 20 is integrally formed with an inter-level insulating film 19 interposed between the first and second field plate electrodes 17X and 18Y.

In the case of the power HEMT shown in FIG. 3 according to the third embodiment, the insulating film thickness below the first field plate electrode 17X is determined by the thickness of the first insulating film 16, while the insulating film thickness below the second field plate electrode 18Y is determined by the total thickness of the first and second insulating films 16 and 20. Accordingly, the insulating film thickness below the second field plate electrode 18Y is larger than the insulating film thickness below the first field plate electrode 17X. In this case, a multistage field plate structure is formed and allows the electric field distribution between the gate and drain to be an ideal state, thereby realizing a high breakdown voltage with a short distance. A field plate structure may be formed also on the drain electrode 15 side, so as to set the electric field distribution between the gate and drain to be closer to an ideal flat state.

When the structure shown in FIG. 3 is manufactured, the first insulating film 16 is first deposited on the barrier layer 2. Then, the gate electrode 13 and first field plate electrode 17X are formed over a portion from the barrier layer 2 to the first insulating film 16. Then, the inter-level insulating film 19 covering the gate electrode 13 and first field plate electrode is deposited along with the second insulating film 20 on the first insulating film 16. Finally, the source electrode 14 and second field plate electrode 18Y are formed over a portion from the barrier layer 2 through the inter-level insulating film 19 to the second insulating film 20. As described above, using the two insulating films 16 and 20

(19) formed in different steps allows a multistage field plate structure to be formed in a short process.

The gate electrode 13 and source electrode 14 may be formed independently of the first and second field plate electrodes 17X and 18Y, respectively. In this case, as shown in FIG. 1, the first field plate electrode 17X is connected to the gate electrode 13 through an outer interconnection, and the second field plate electrode 18X is connected to the source electrode 14 through an outer interconnection.

(Fourth Embodiment)

Figure 4:
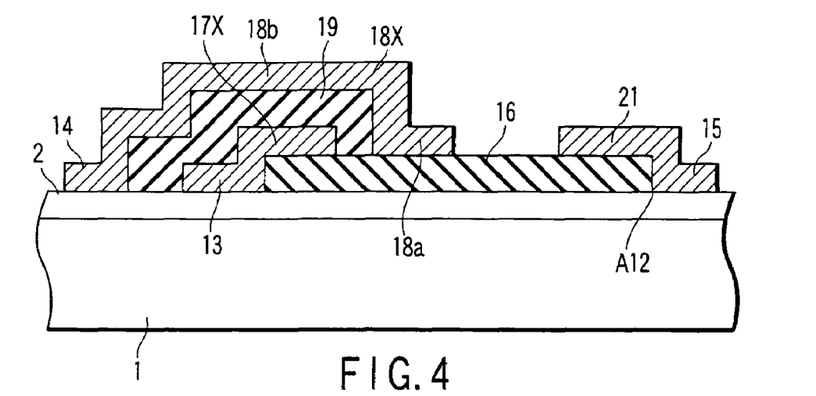
FIG. 4 is a sectional view schematically showing a nitride-based power semiconductor device (GaN-based power HEMT) according to a fourth embodiment of the present invention.

FIG. 4 is a sectional view schematically showing a nitride-based power semiconductor device (GaN-based power HEMT) according to a fourth embodiment of the present invention.

As shown in FIG. 4, this power HEMT includes semiconductor layers 1 and 2, electrodes 13, 14, 17X, and 18X, and insulating films 16 and 19 in the same manner as in the power HEMT shown in FIG. 2, while it further includes a third field plate electrode 21 disposed on the first insulating film 16 on a drain electrode 15 side. The third field plate electrode 21 is integrally formed with and thus electrically connected to the drain electrode 15.

In the power HEMT shown in FIG. 4 according to the fourth embodiment, the third field plate electrode 21 relaxes the electric field concentration at a corner A12 of the drain electrode 15 due to the voltage between the gate and drain. As a consequence, the power HEMT shown in FIG. 4 further improves the breakdown voltage, as compared to the power HEMT shown in FIG. 2.

(Fifth Embodiment)

Figure 5:
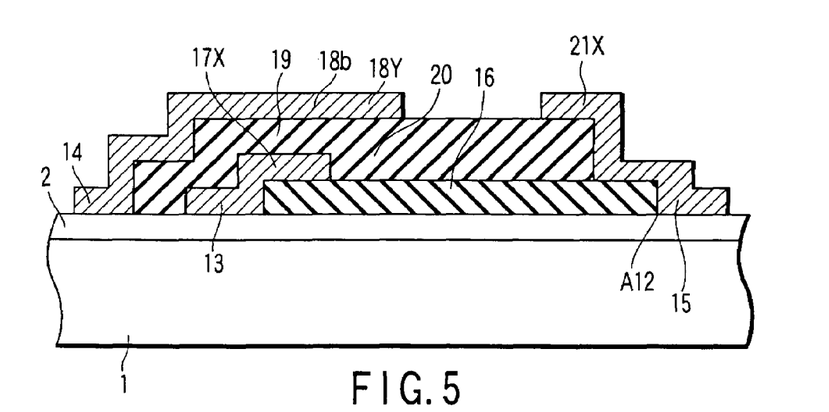
FIG. 5 is a sectional view schematically showing a nitride-based power semiconductor device (GaN-based power HEMT) according to a fifth embodiment of the present invention.

FIG. 5 is a sectional view schematically showing a nitride-based power semiconductor device (GaN-based power HEMT) according to a fifth embodiment of the present invention.

As shown in FIG. 5, this power HEMT includes semiconductor layers 1 and 2, electrodes 13, 14, 17X, and 18y, and insulating films 16, 19, and 20 in the same manner as in the power HEMT shown in FIG. 3, while it further includes a third field plate electrode 21X disposed over a portion from the first insulating film 16 to the second insulating film 20 on a drain electrode 15 side. The third field plate electrode 21X is integrally formed with and thus electrically connected to the drain electrode 15.

Also in the power HEMT shown in FIG. 5 according to the fifth embodiment, the third field plate electrode 21X relaxes the electric field concentration at a corner A12 of the drain electrode 15. Furthermore, since the third field plate electrode 21X has a multistage field plate structure on the first and second insulating films 16 and 20, the electric field distribution between the gate and drain can be closer to an ideal flat state. As a consequence, the power HEMT shown in FIG. 5 further improves the breakdown voltage, as compared to the power HEMT shown in FIG. 3.

(Sixth Embodiment)

Figure 6:
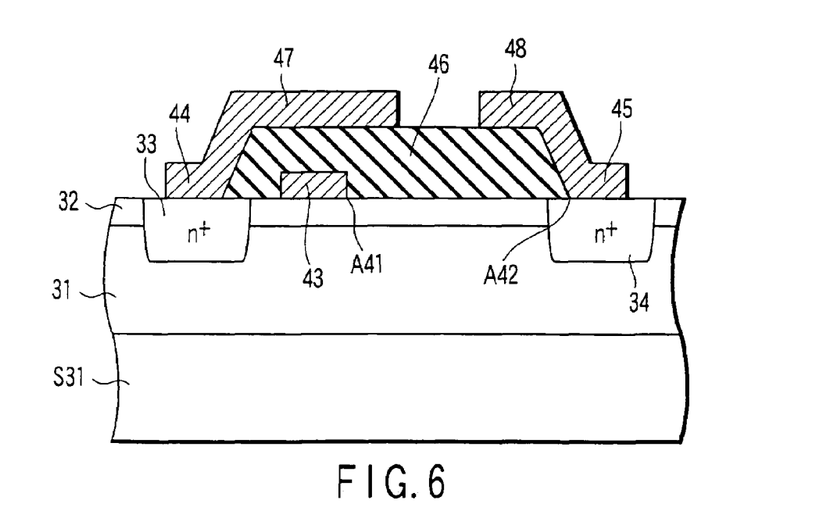
FIG. 6 is a sectional view schematically showing a nitride-based power semiconductor device (GaN-based power HEMT) according to a sixth embodiment of the present invention.

FIG. 6 is a sectional view schematically showing a nitride-based power semiconductor device (GaN-based power HEMT) according to a sixth embodiment of the present invention.

As shown in FIG. 6, this power HEMT includes a channel layer (first semiconductor layer) 31 of the non-doped type disposed on a support substrate S31 of sapphire, and a barrier layer (second semiconductor layer) 32 of the non-doped or n-type disposed on the channel layer 31. A source contact layer (first contact layer) 33 and a drain contact layer (second contact layer) 34, both of which are of the n-type and have a low resistivity (a high impurity concentration), are formed separately from each other in the surface of the barrier layer 32. The source and drain contact layers 33 and 34 extend beyond the interface between the channel layer 31 and barrier layer 32 into the channel layer 31.

The channel layer 31 consists of $Al_XGa_{1-X}N$ ($0 \leq X \leq 1$), e.g., GaN. The barrier layer 32 consists of $Al_YGa_{1-Y}N$ ($0 \leq Y \leq 1$, X<Y), e.g., $Al_{0.2}Ga_{0.8}N$. On the other hand, the source and drain contact layers 33 and 34 may be formed of a process that forms a groove by etching and then forms a buried layer therein by selective growth; a process that employs ion implantation of an n-type impurity and heat treatment; or the like. Accordingly, the compositions of the source and drain contact layers 33 and 34 are determined by the process. However, the source and drain contact layers 33 and 34 can be expressed by a general formula, $Al_ZGa_{1-Z}N$ ($0 \leq Z \leq 1$).

A source electrode 44 is disposed on and in electrical contact with the source contact layer 33. A drain electrode 45 is disposed on and in electrical contact with the drain contact layer 34. A gate electrode 43 is disposed between the source electrode 44 and drain electrode 45 on the barrier layer 2, and faces the channel layer 31 through the barrier layer 32.

The gate electrode 43 and barrier layer 32 are covered with an insulating film 46 between the source electrode 44 and drain electrode 45. A first field plate electrode 47 and a second field plate electrode 48 are disposed on the insulating film 46. The first field plate electrode 47 is integrally formed with and thus electrically connected to the source electrode 44. The second field plate electrode 48 is integrally formed with and thus electrically connected to the drain electrode 45.

The source electrode 44 and drain electrode 45 may be formed independently of the first and second field plate electrodes 47 and 48, respectively. In this case, the first field plate electrode 47 is connected to the source electrode 44 through an outer interconnection, and the second field plate electrode 48 is connected to the drain electrode 45 through an outer interconnection.

As described previously, where a nitride-based semiconductor is used as the device material, a high critical electric field is brought about, and thus a high breakdown voltage is expected. In addition to this, the power HEMT shown in FIG. 6 includes the first and second field plate electrodes 47 and 48 disposed between the gate and drain, at which the breakdown voltage is determined. As a consequence, the electric field concentrations at a corner A41 of the gate electrode 43 and at a corner A42 of the drain electrode 41 are relaxed, thereby improving the breakdown voltage.

In the case of GaN-based power HEMTs, two-dimensional electron gas having a high mobility is generated at the AlGaN/GaN hetero-interface, and a low on-resistance is thereby expected. In addition to this, the power HEMT shown in FIG. 6 includes the source and drain contact layers 33 and 34 having a low resistivity, through which the source electrode 44 and drain electrode 45 come into contact with the barrier layer 32. As a consequence, the contact resistance lowers, thereby further reducing the on-resistance.

In this respect, the conventional device structures shown in FIGS. 14 and 15 includes no contact layers. Accordingly, when a high voltage is applied thereto, electric field peaks appear at ends of the source electrode 114 and drain electrode 115 (particularly the drain electrode 115), and thus the electric field distribution has sharp peaks at positions near the surface of the barrier layer 102. Such a shape corresponds to a state where the diffusion layer depth is almost zero in a Si device structured by diffusion layers. Where the breakdown voltage is determined by the high electric field peaks near the surface, the breakdown voltage depends on the surface state or the electrode shapes.

On the other hand, the power HEMT shown in FIG. 6 includes the source and drain contact layers 33 and 34, which shift the highest points of electric field to positions in a semiconductor layer (the channel layer 1 according to the sixth embodiment) at the bottom of the contact layers 33 and 34. In addition, the first and second field plate electrodes 47 and 48 relax the electric field peaks within themselves. As a consequence, the device becomes less sensitive to the process result, such as the surface state, and a stable operation is thereby expected. To put it simply, the combination of the first and second field plate electrodes 47 and 48 with the source and drain contact layers 33 and 34 makes it possible to realize not only a high breakdown voltage and low on-resistance, but also stable characteristics with high reliability, less sensitive to process variations.

(Seventh Embodiment)

Figure 7:
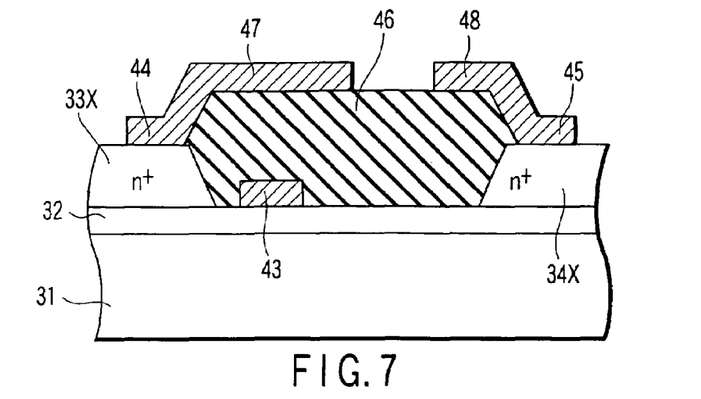
FIG. 7 is a sectional view schematically showing a nitride-based power semiconductor device (GaN-based power HEMT) according to a seventh embodiment of the present invention.

FIG. 7 is a sectional view schematically showing a nitride-based power semiconductor device (GaN-based power HEMT) according to a seventh embodiment of the present invention.

As shown in FIG. 7, this power HEMT includes semiconductor layers 31 and 32, electrodes 43, 44, 45, 47, and 48, and an insulating film 46 in the same manner as in the power HEMT shown in FIG. 6, while it includes source and drain contact layers 33X and 34X disposed in a different manner from the source and drain contact layers 33 and 34 shown in FIG. 6. The source and drain contact layers 33X and 34X consist of a semiconductor layer that is formed by crystal growth and patterning on the barrier layer 32, and expressed by a general formula, $Al_ZGa_{1-Z}N$ ($0 \leq Z \leq 1$). The source and drain contact layers 33X and 34X protrude on the surface of the barrier layer 32, arid a gate electrode 33 is interposed therebetween. Namely, this device structure is of the recess gate type.

Also in the power HEMT shown in FIG. 7 according to the seventh embodiment, the combination of the first and second field plate electrodes 47 and 48 with the source and drain contact layers 33X and 34X makes it possible to realize a high breakdown voltage and low on-resistance. Furthermore, the source and drain contact layers 33X and 34X can be formed by one step of crystal growth, thereby simplifying the process.

(Eighth Embodiment)

Figure 8:
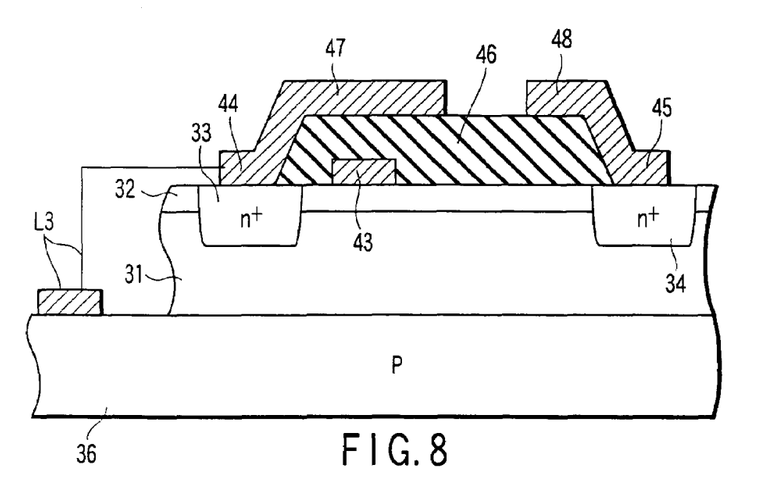
FIG. 8 is a sectional view schematically showing a nitride-based power semiconductor device (GaN-based power HEMT) according to an eighth embodiment of the present invention.

FIG. 8 is a sectional view schematically showing a nitride-based power semiconductor device (GaN-based power HEMT) according to an eighth embodiment of the present invention.

As shown in FIG. 8, this power HEMT includes a lower layer 36 of the p-type disposed below a channel layer 31, in addition to the same device structure as the power HEMT shown in FIG. 6. The lower layer 36 consists of $Al_XGa_{1-X}N$ ($0 \leq X \leq 1$), e.g., GaN. The lower layer 36 is electrically connected to a source electrode 44 through an electrode and interconnection L3.

In the power HEMT shown in FIG. 8 according to the eighth embodiment, when a high voltage applied thereto causes avalanche breakdown, generated holes are swiftly discharged through the p-type lower layer 36. Accordingly, this structure can improve the tolerance against avalanche breakdown. The lower layer 36 may be electrically connected to a gate electrode 43, wherein holes are discharged in the same way as described above. The electrode and interconnection L3 from the lower layer 36 may be disposed not on the same side as the source electrode 44, but on the bottom side.

Figure 9:
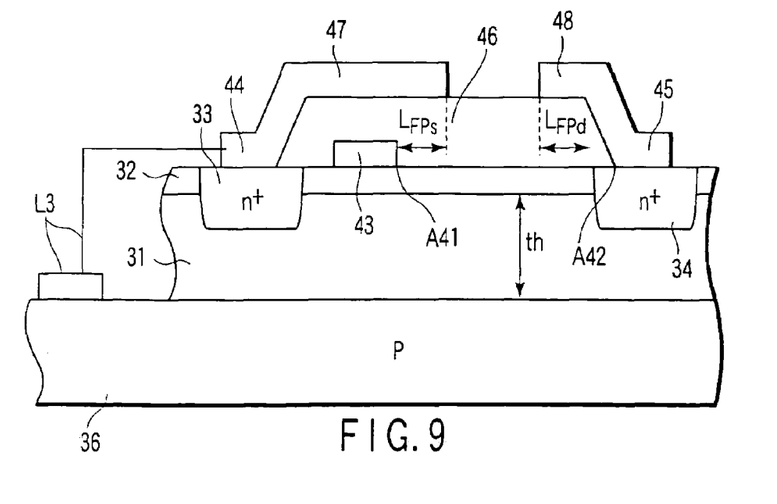
FIG. 9 is a sectional view schematically showing a nitride-based power semiconductor device (GaN-based power HEMT) according to a modification of the eighth embodiment of the present invention.

FIG. 9 is a sectional view schematically showing a nitride-based power semiconductor device (GaN-based power HEMT) according to a modification of the eighth embodiment of the present invention.

As shown in FIG. 9, this power HEMT has an arrangement in that the ratio between the effective plate lengths (projected lengths on the plan view) of first and second field plate electrodes 47 and 48 is set to be 0.9 to 1.1, e.g., almost equal, in the same device structure as the power HEMT shown in FIG. 8. The effective plate length LFPs of the first field plate electrode 47 is the length of its electrode portion that extends from a position corresponding to the end of a gate electrode 43 toward a drain electrode 45, in a direction connecting a source electrode 44 and the drain electrode 45. The effective plate length LFPd of the second field plate electrode 48 is the length of its electrode portion that extends on an insulating film 46 in the same direction.

In designing the field plate electrodes, the effective plate lengths are important parameters. Where the ratio between the effective plate lengths (projected lengths on the plan view) LFPs and LFPd of the first and second field plate electrodes 47 and 48 is set to be 0.9 to 1.1, e.g., almost equal, the first and second field plate electrodes 47 and 48 can relax, in the same level, the electric fields at a corner A41 of the gate electrode 43 and at a corner A42 of the drain electrode 45. This is also true of the power HEMTs shown in FIGS. 6 and 7 according to the sixth and seventh embodiments.

Figure 10:
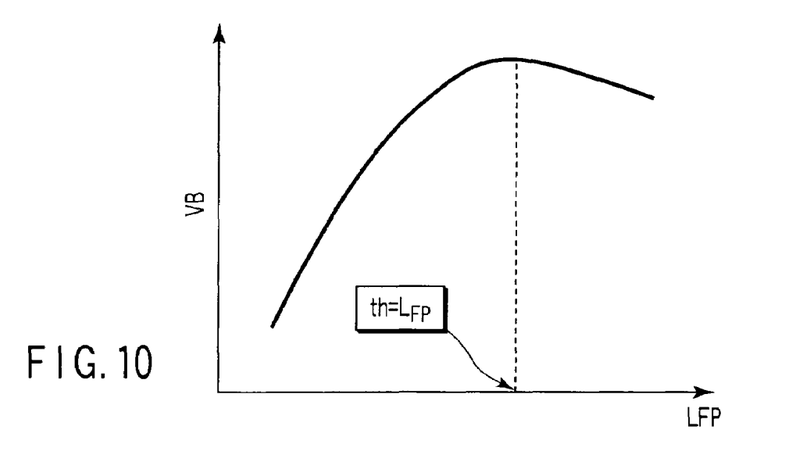
FIG. 10 is a graph showing change in breakdown voltage VB with change in the effective plate length LFP of each of first and second field plate electrodes in the power HEMT shown in FIG. 9.

Incidentally, where a lower layer 36 of the p-type is connected to the source electrode 44, the lower layer 36 also functions as a field plate that shields the electric field in a channel layer 31. FIG. 10 is a graph showing change in breakdown voltage VB with change in the effective plate length LFP of each of the first and second field plate electrodes 47 and 48 in the power HEMT shown in FIG. 9.

As shown in FIG. 10, where the effective plate length LFP is almost equal to the thickness th of the channel layer 31, the breakdown voltage obtained is the highest. Where the effective plate length LFP is smaller than the thickness th, the breakdown voltage decreases because the electric field is less relaxed by the first and second field plate electrodes 47 and 48. In contrast, where the effective plate length LFP is larger than the thickness th, although the electric field is sufficiently relaxed by the first and second field plate electrodes 47 and 48, the breakdown voltage decreases because the distance between the first and second field plate electrodes 47 and 48 is shorter. However, in order to reliably relax the electric field by the first and second field plate electrodes 47 and 48, it is preferable to set the effective plate length LFP to be larger than the thickness th of the channel layer 31.

The p-type lower layer 36 used for exhausting holes may be applied to a device structure of the recess gate type, such as the power HEMT shown in FIG. 7, to obtain the same effect as described above. Furthermore, the design of the effective plate lengths of the first and second field plate electrodes 47 and 48 explained with reference to FIG. 10 may be applied to a device structure of the recess gate type, such as the power HEMT shown in FIG. 7, to obtain the same effect as described above. The design of the effective plate lengths may be also similarly applied to a device in which a conductive support substrate is used in place of the lower layer 36 and connected to a source.

(Ninth Embodiment)

Figure 11:
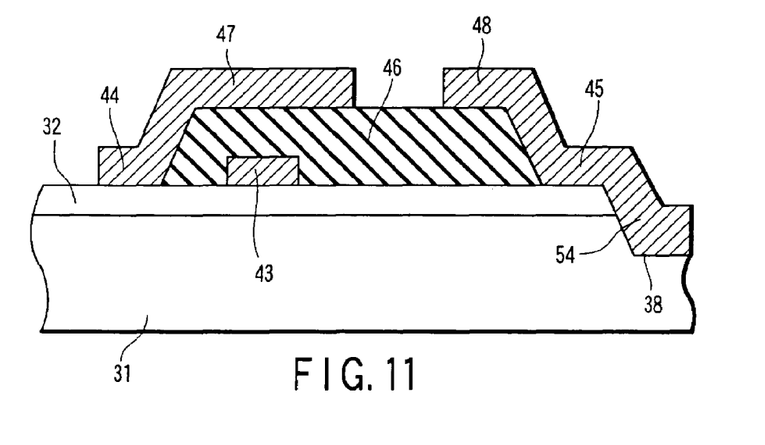
FIG. 11 is a sectional view schematically showing a nitride-based power semiconductor device (GaN-based power HEMT) according to a ninth embodiment of the present invention.

FIG. 11 is a sectional view schematically showing a nitride-based power semiconductor device (GaN-based power HEMT) according to a ninth embodiment of the present invention.

As shown in FIG. 11, this power HEMT includes semiconductor layers 31 and 32, electrodes 43, 44, 47, and 48, and an insulating film 46 in the same manner as in the power HEMT shown in FIG. 6, while it does not include the source and drain contact layers 33 and 34 shown in FIG. 6. In this case, the source electrode 44 and a drain electrode 45 are disposed on and in electrical contact with the barrier layer 32, and separately from each other. A drain contact electrode 54 is disposed adjacent to the drain electrode 45 and in contact with the channel layer 31 and barrier layer 32. The drain contact electrode 54 is integrally formed with and thus electrically connected to the drain electrode 45. The drain contact electrode 54 is disposed in a trench 38 that extends from the surface of the barrier layer 32 through the interface between the channel layer 31 and barrier layer 32 into the channel layer 31.

In the power HEMT shown in FIG. 11 according to the ninth embodiment, the drain electrode 45 makes contact with the barrier layer 32 and channel layer 31 through the drain contact electrode 54. As a consequence, the curvature at the drain end becomes larger, thereby relaxing the electric field, as in a case where a deep diffusion layer is formed in the barrier layer 32 and channel layer 31. In addition, the avalanche point is formed not on the surface of the barrier layer 32 in contact with the insulating film 46, but at a portion where the drain contact electrode 54 makes contact with the channel layer 31. As a consequence, the device becomes less sensitive to the process result, such as the surface state, and a stable operation is thereby expected. In order to relax the electric field, the drain contact electrode 54 is preferably inclined, as shown in FIG. 11.

(Tenth Embodiment)

Figure 12:
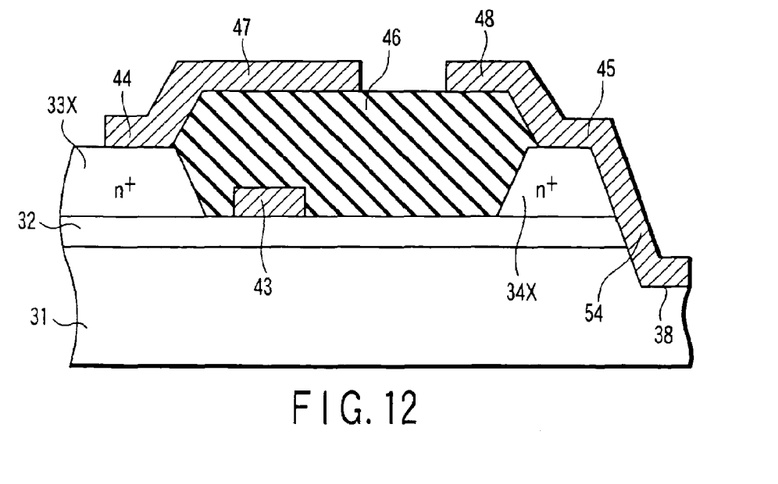
FIG. 12 is a sectional view schematically showing a nitride-based power semiconductor device (GaN-based power HEMT) according to a tenth embodiment of the present invention.

FIG. 12 is a sectional view schematically showing a nitride-based power semiconductor device (GaN-based power HEMT) according to a tenth embodiment of the present invention.

As shown in FIG. 12, this power HEMT includes a drain contact electrode 54 disposed in contact with a channel layer 31, a barrier layer 32, and a drain contact layer 34X, in addition to the same device structure as the power HEMT shown in FIG. 7, which is of the recess gate type. The drain contact electrode 54 is integrally formed with and thus electrically connected to a drain electrode 45. The drain contact electrode 54 is disposed in a trench 38 that extends from the surface of the drain contact layer 34X through the interface between the channel layer 31 and barrier layer 32 into the channel layer 31.

In the power HEMT shown in FIG. 12 according to the tenth embodiment, avalanche breakdown is caused at the drain contact electrode (trench contact portion) 54, thereby realizing high reliability.

(Eleventh Embodiment)

Figure 13:
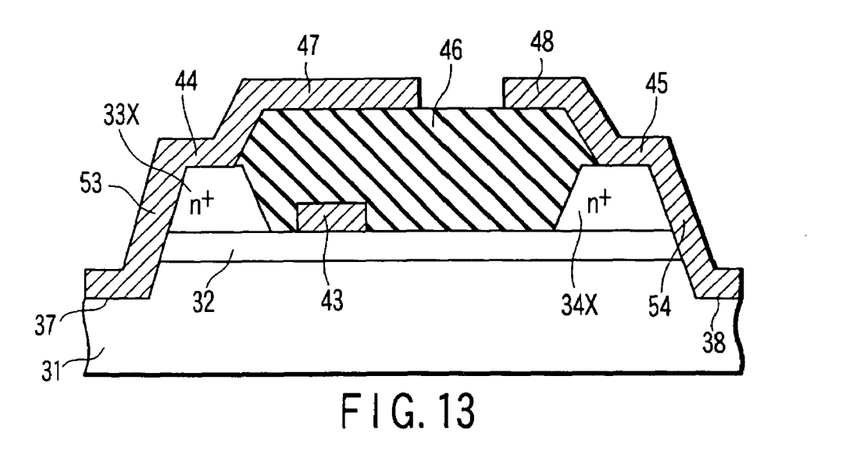
FIG. 13 is a sectional view schematically showing a nitride-based power semiconductor device (GaN-based power HEMT) according to an eleventh embodiment of the present invention.

FIG. 13 is a sectional view schematically showing a nitride-based power semiconductor device (GaN-based power HEMT) according to an eleventh embodiment of the present invention.

As shown in FIG. 13, this power HEMT includes a source contact electrode 53 disposed in contact with a channel layer 31, a barrier layer 32, and a source contact layer 33X, in addition to the same device structure as the power HEMT shown in FIG. 12. The source contact electrode 53 is integrally formed with and thus electrically connected to a source electrode 44. The source contact electrode 53 is disposed in a trench 37 that extends from the surface of the source contact layer 33X through the interface between the channel layer 31 and barrier layer 32 into the channel layer 31.

In the power HEMT shown in FIG. 13 according to the eleventh embodiment, since the source electrode 44 side and the drain electrode 45 side have the same structure, the device can be manufactured by a simplified process.

In the first to eleventh embodiments described above, the field plate structure may be a multistage structure, in place of a single stage structure. The support substrate material is not limited to sapphire, but may be another material. The semiconductor layer structure is not limited to AlGaN/GaN shown as an example, but may be a semiconductor layer structure of another nitride-based material, such as GaN/InGaN or AlN/AlGaN.

The embodiments described above are not limited to a HEMT, but may be similarly applied to a MISFET, which further includes a gate an insulating film. The embodiments described above may be applied not to a switching device, but to a lateral SBD, because it has a lateral SBD (Schottky Barrier Diode) structure as a structure between the gate and drain. The embodiments described above may be applied not to a unipolar device, but to a bipolar device, such as a pin-diode, or an IGBT including a MISFET with a p-type layer on its drain side, as long as it is a lateral device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device comprising:
a first semiconductor layer of non-doped $Al_XGa_{1-X}N$ ($0 \leq X \leq 1$);
a second semiconductor layer of non-doped or n-type $Al_YGa_{1-Y}N$ ($0 \leq Y \leq 1$, $X<Y$) disposed on the first semiconductor layer;
source and drain electrodes disposed separately from each other, and electrically connected to the second semiconductor layer;
a gate electrode disposed on the second semiconductor layer between the source and drain electrodes;
an insulating film covering the second semiconductor layer between the gate and drain electrodes;
a first field plate electrode disposed on the insulating film and electrically connected to the gate electrode; and
a second field plate electrode disposed on the insulating film and electrically connected to the source electrode,
wherein the second field plate electrode comprises an intermediate electrode portion interposed between the first field plate electrode and the drain electrode,
wherein the insulating film comprises a first insulating film disposed on the second semiconductor layer, and the first field plate electrode and the intermediate electrode portion are disposed on the first insulating film,
wherein the second field plate electrode comprises a covering electrode portion that connects the source electrode to the intermediate electrode portion and covers the first field plate electrode through an interlevel insulating film.

2. A power semiconductor device comprising:
a first semiconductor layer of non-doped $Al_xGa_{1-x}N$ ($0 \leq X \leq 1$);
a second semiconductor layer of non-doped or n-type $Al_YGa_{1-Y}N$ ($0 \leq Y \leq 1, X<Y$) disposed on the first semiconductor layer;
source and drain electrodes disposed separately from each other, and electrically connected to the second semiconductor layer;
a gate electrode disposed on the second semiconductor layer between the source and drain electrodes;
an insulating film covering the second semiconductor layer between the gate and drain electrodes;
a first field plate electrode disposed on the insulating film and electrically connected to the gate electrode; and
a second field plate electrode disposed on the insulating film and electrically connected to the source electrode,
wherein the second field plate electrode comprises a covering electrode portion that covers the first field plate electrode through an inter-level insulating film and has a distal end extending beyond the first field plate electrode toward the drain electrode.

3. A power semiconductor device comprising:
a first semiconductor layer of non-doped $Al_xGa_{1-x}N$ ($0 \leq X \leq 1$);
a second semiconductor layer of non-doped or n-type $Al_YGa_{1-Y}N$ ($0 \leq Y \leq 1, X<Y$) disposed on the first semiconductor layer;
source and drain electrodes disposed separately from each other, and electrically connected to the second semiconductor layer;
a gate electrode disposed on the second semiconductor layer between the source and drain electrodes;
an insulating film covering the second semiconductor layer between the gate and drain electrodes;
a first field plate electrode disposed on the insulating film and electrically connected to the gate electrode; and
a second field plate electrode disposed on the insulating film and electrically connected to the source electrode,
wherein the second field plate electrode comprises a covering electrode portion that covers the first field plate electrode through an inter-level insulating film and has a distal end extending beyond the first field plate electrode toward the drain electrode.

4. The device according to claim 3, wherein the insulating film comprises a first insulating film disposed on the second semiconductor layer and a second insulating film disposed on the first insulating film, the first field plate electrode is disposed on the first insulating film, and the second field plate electrode is disposed on the second insulating film.

5. A power semiconductor device comprising:
a first semiconductor layer of non-doped $Al_xGa_{1-x}N$ ($0 \leq X \leq 1$);
a second semiconductor layer of non-doped or n-type $Al_YGa_{1-Y}N$ ($0 \leq Y \leq 1, X<Y$) disposed on the first semiconductor layer;
source and drain electrodes disposed separately from each other, and electrically connected to the second semiconductor layer;
a gate electrode disposed on the second semiconductor layer between the source and drain electrodes;
an insulating film covering the second semiconductor layer between the gate and drain electrodes;
a first field plate electrode disposed on the insulating film and electrically connected to the gate electrode;
a second field plate electrode disposed on the insulating film and electrically connected to the source electrode; and
a third field plate electrode disposed on the insulating film and electrically connected to the drain electrode.

6. The device according to claim 5, wherein the insulating film comprises a first insulating film disposed on the second semiconductor layer, and the first and third field plate electrodes are disposed on the first insulating film.

7. The device according to claim 5, wherein the insulating film comprises a first insulating film disposed on the second semiconductor layer and a second insulating film disposed on the first insulating film, the first field plate electrode is disposed on the first insulating film, and the third field plate electrode includes a portion disposed on the second insulating film.

8. A power semiconductor device comprising:
a first semiconductor layer of non-doped $Al_xGa_{1-x}N$ ($0 \leq X \leq 1$);
a second semiconductor layer of non-doped or n-type $Al_YGa_{1-Y}N$ ($0 \leq Y \leq 1, X<Y$) disposed on the first semiconductor layer;
first and second contact layers of n-type $Al_ZGa_{1-Z}N$ ($0 \leq Z \leq 1$) disposed separately from each other on or in a surface of the second semiconductor layer, and having a resistivity lower than that of the second semiconductor layer;
source and drain electrodes disposed on the first and second contact layers, respectively;
a gate electrode disposed on the second semiconductor layer between the source and drain electrodes;
an insulating film covering the second semiconductor layer between the source and drain electrodes;
a first field plate electrode disposed on the insulating film and electrically connected to the source electrode; and
a second field plate electrode disposed on the insulating film and electrically connected to the drain electrode.

9. The device according to claim 8, wherein the first and second contact layers are formed in the surface of the second semiconductor layer, and extend beyond an interface between the first and second semiconductor layers into the first semiconductor layer.

10. The device according to claim 8, wherein the first and second contact layers protrude on the surface of the second semiconductor layer on a side opposite to the first semiconductor layer.

11. The device according to claim 8, further comprising a third semiconductor layer of p-type $Al_xGa_{1-x}N$ ($0 \leq X \leq 1$) disposed on the first semiconductor layer on a side opposite to the second semiconductor layer.

12. The device according to claim 11, wherein the third semiconductor layer is electrically connected to the source electrode.

13. The device according to claim 8, wherein a ratio between first and second projected lengths in a direction connecting the source and drain electrodes is set to be 0.9 to 1.1, where the first projected length denotes a portion of the first field plate electrode that extends beyond an end of the gate electrode toward the drain electrode, and the second projected length denotes a portion of the second field plate electrode on the insulating film.

14. The device according to claim 13, wherein the second projected length is set larger than a thickness of the first semiconductor layer.

15. A power semiconductor device comprising:
a first semiconductor layer of non-doped $Al_xGa_{1-x}N$ ($0 \leq X \leq 1$);

a second semiconductor layer of non-doped or n-type $Al_YGa_{1-Y}N$ ($0 \leq Y \leq 1$, $X<Y$) disposed on the first semiconductor layer;

source and drain electrodes disposed separately from each other, and electrically connected to the second semiconductor layer;

a gate electrode disposed on the second semiconductor layer between the source and drain electrodes;

an insulating film disposed on the second semiconductor layer between the source and drain electrodes, and covering the gate electrode;

a first field plate electrode disposed on the insulating film and electrically connected to the source electrode;

a second field plate electrode disposed on the insulating film and electrically connected to the drain electrode; and a drain contact electrode disposed in contact with the first and second semiconductor layers at a position adjacent to the drain electrode, and electrically connected to the drain electrode.

16. The device according to claim 15, wherein the drain contact electrode is disposed in a trench that extends from a surface of the second semiconductor layer through an interface between the first and second semiconductor layers into the first semiconductor layer.

17. The device according to claim 15, further comprising a source contact electrode disposed in contact with the first and second semiconductor layers at a position adjacent to the source electrode, and electrically connected to the source electrode.

18. The device according to claim 17, wherein the source contact electrode is disposed in a trench that extends from a surface of the second semiconductor layer through an interface between the first and second semiconductor layers into the first semiconductor layer.

19. The device according to claim 15, further comprising first and second contact layers of n-type $Al_ZGa_{1-Z}N$ ($0 \leq Z \leq 1$) disposed separately from each other on the second semiconductor layer, and having a resistivity lower than that of the second semiconductor layer, wherein the source and drain electrodes are disposed on the first and second contact layers, respectively.

* * * * *